(12) United States Patent
Shenoy et al.

(10) Patent No.: US 6,198,635 B1
(45) Date of Patent: Mar. 6, 2001

(54) INTERCONNECT LAYOUT PATTERN FOR INTEGRATED CIRCUIT PACKAGES AND THE LIKE

(75) Inventors: Jayarama N. Shenoy, Santa Clara; Sanjay Dandia, San Jose, both of CA (US)

(73) Assignee: VSLI Technology, Inc., San Jose, CA (US)

( * ) Notice: Subject to any disclaimer, the term of this patent is extended or adjusted under 35 U.S.C. 154(b) by 0 days.

(21) Appl. No.: 09/313,685

(22) Filed: May 18, 1999

(51) Int. Cl.[7] ................................................. H05K 1/18
(52) U.S. Cl. .................... 361/760; 361/777; 361/795; 257/691; 257/773; 257/778; 257/786; 257/728; 174/261; 174/262; 174/266; 333/12; 333/247; 228/180.21; 228/180.22
(58) Field of Search ..................... 361/760, 777, 361/745, 764, 765, 767, 772, 783, 792, 794; 257/686, 691, 773, 778, 774, 786, 728, 737, 738; 174/254, 255, 258, 259, 260, 261, 262, 266; 333/12, 247; 228/180.21, 180.22

(56) References Cited

U.S. PATENT DOCUMENTS

| | | | |
|---|---|---|---|
| 4,598,166 | * | 7/1986 | Neese .................................. 174/261 |
| 5,450,290 | * | 9/1995 | Boyko et al. ....................... 361/792 |
| 5,475,264 | * | 12/1995 | Sudo et al. .......................... 257/723 |
| 5,477,933 | * | 12/1995 | Nguyen ............................... 174/262 |
| 5,741,729 | * | 4/1998 | Selna .................................. 438/125 |
| 5,790,384 | * | 8/1998 | Ahmad et al. ...................... 361/760 |
| 5,952,726 | * | 9/1999 | Liang .................................. 257/778 |
| 5,953,213 | * | 9/1999 | Napierala ............................ 361/760 |
| 5,994,766 | * | 11/1999 | Shenoy et al. ...................... 257/659 |
| 6,008,534 | * | 12/1999 | Fulcher ............................... 257/691 |
| 6,064,113 | * | 5/2000 | Kirkman ............................. 257/691 |
| 6,075,710 | * | 6/2000 | Lau ..................................... 361/760 |
| 6,111,756 | * | 8/2000 | Moresco ............................. 361/735 |

* cited by examiner

*Primary Examiner*—Jeffrey Gaffin
*Assistant Examiner*—David Foster
(74) *Attorney, Agent, or Firm*—Wood, Herron & Evans, L.L.P.

(57) ABSTRACT

A circuit arrangement for interconnecting electronic components such as integrated circuit devices, chip packages and/or circuit boards includes signal, first fixed potential (e.g., power) and second fixed potential (e.g., ground) interconnects arranged into an interconnection layout pattern that offers greater flexibility, performance and cost effectiveness than conventional patterns. In some implementations, the interconnection layout pattern incorporates one or more tiles of interconnects, with each tile defining a plurality of interconnect positions arranged into at least three rows and at least four columns. For each tile, a signal interconnect is disposed at each of the three interconnect positions in each of the first and fourth columns, and one each of a signal interconnect, a first fixed potential interconnect and a second fixed potential interconnect are disposed in each of the second and third columns. In other implementations, the interconnection layout pattern arranges the interconnects into an array that defines interior and boundary interconnect positions, with each interconnect disposed at an interior interconnect position bordered on each side by another interconnect in the array, and with each signal interconnect disposed at an interior interconnect position in the array immediately adjacent to at least one first fixed potential interconnect and at least one second fixed potential interconnect.

31 Claims, 8 Drawing Sheets

INTERCONNECT LAYOUT PATTERN FOR INTEGRATED CIRCUIT PACKAGES AND THE LIKE

FIELD OF THE INVENTION

The invention is generally related to integrated circuit device packaging, and more particularly, to the layout of integrated circuit device interconnects for use therein.

BACKGROUND OF THE INVENTION

As integrated circuit devices become faster and more complex, the interconnections between such devices with one another and with other components on a circuit board can limit the performance achievable in an integrated circuit system. Whereas integrated circuit devices, also referred to as "chips", once had only a few interconnects, often hundreds of interconnects are now required in more complex devices. Forming hundreds of interconnects between a chip and a circuit board, however, can be difficult since chips are typically fabricated with significantly finer details than can be fabricated onto circuit boards. Thus, to connect a fine resolution chip to a circuit board, often some form of packaging is required to route signals between the chip and the circuit board.

The resolution of a component such as a chip or circuit board is often represented in terms of "pitch", which is the minimum distance between interconnects on a component. For example, chips may have off-chip interconnects separated by 200 microns or less, while a typical circuit board may only be capable of utilizing interconnects separated by 800 to 1000 microns or more. To provide the necessary interface, a chip package is typically used that has a substrate with one side having interconnects disposed at a corresponding pitch for the chip, and with the other side having interconnects disposed at a corresponding pitch for the circuit board. Conductive traces disposed within one or more layers in the package substrate then route the signals between the chip and the circuit board, using vias and/or through holes to route signals between multiple layers. One particular type of interconnect configuration is a ball grid array (BGA), which utilizes an array of metallic balls that interface with a corresponding array of interconnection pads on a circuit board.

Chip packages are often subject to a number of tradeoffs, particularly between performance and cost. Furthermore, the design of a chip package may also impact the performance and cost of the circuit board with which the chip package is used. In particular, system performance is often limited by noise encountered in signals transmitted between a chip package and a circuit board. One predominant form of noise is simultaneously-switching output (SSO) noise that occurs when multiple signals are switching at the same time. Noise often increases as the pitch of interconnects decreases due to the closer proximity of the interconnects. Moreover, reducing the pitch of interconnects can require additional circuit layers on one or both of the chip package and the circuit board to route signals consistent with design rules, which often increases noise due to the presence of longer vias.

Likewise, requiring additional circuit layers in a package and/or circuit board increases costs due to increased complexity, materials and manufacturing costs. In particular, requiring additional layers in a circuit board can dramatically increase the cost of the circuit board.

Traditionally, the layouts of the interconnects between a chip package and a circuit board have diverged into high performance/high cost layouts and low performance/low cost layouts. Some high performance BGA layouts, for example, utilize balls and interconnection pads arranged into a plurality of tiles forming an unchanneled, "chevron" pattern. With a chevron pattern, e.g., as shown by circuit board 10 of FIG. 9, columns of alternating power (V) and ground (G) fixed potential interconnection pads 12, 14 are interposed between pairs of columns of signal (S) interconnection pads 16, providing a 4:1:1 signal:power:ground interconnect ratio. Each interconnection pad 12–16 is then electrically coupled to a via 18 for distribution to another layer in the circuit board. A corresponding layout of balls is provided on the underside of the chip packaging (not shown).

Figure 9:
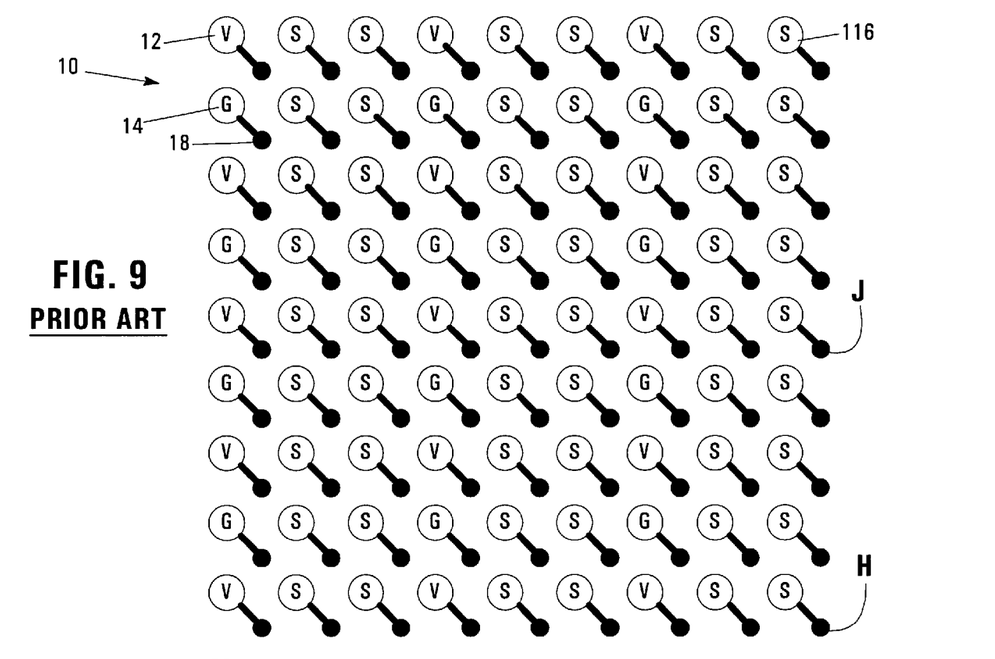
FIG. 9 is a plan view of a circuit board utilizing a conventional chevron interconnect layout pattern.

A benefit of the chevron pattern is that electrical performance is often acceptable for high performance applications. A limitation of the chevron pattern, however, is that, at smaller pitches, the ability to route signals away from the array (known as "escape routing") often requires more layers in the circuit board, which increases costs and decreases performance.

Figure 10:
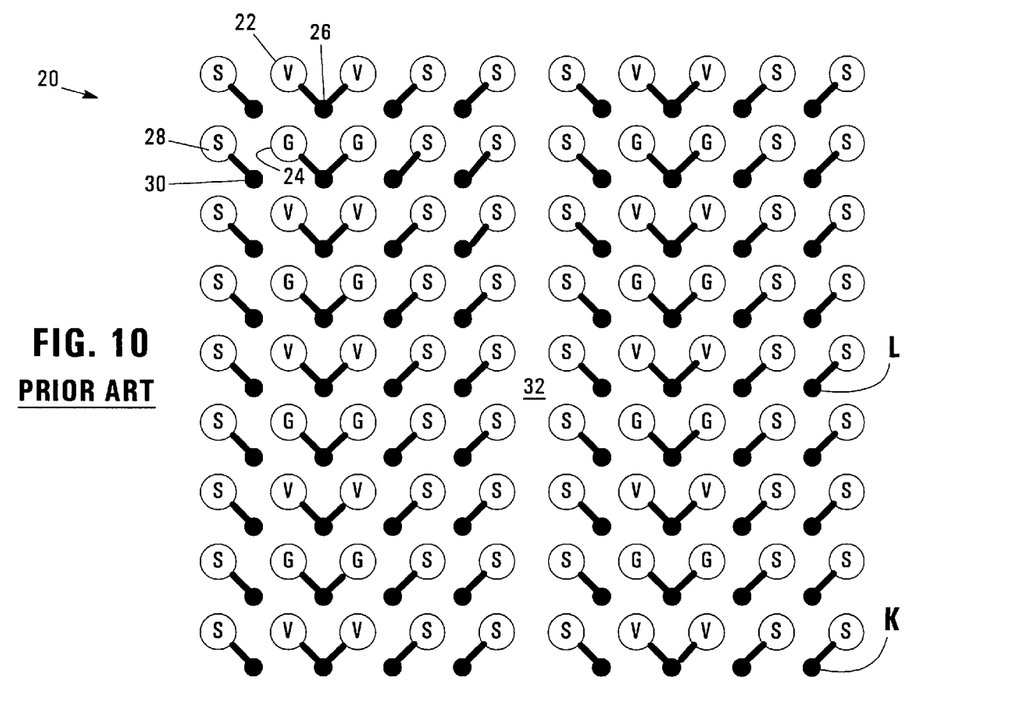
FIG. 10 is a plan view of a circuit board utilizing a conventional channeled interconnect layout pattern.
Figure 11:
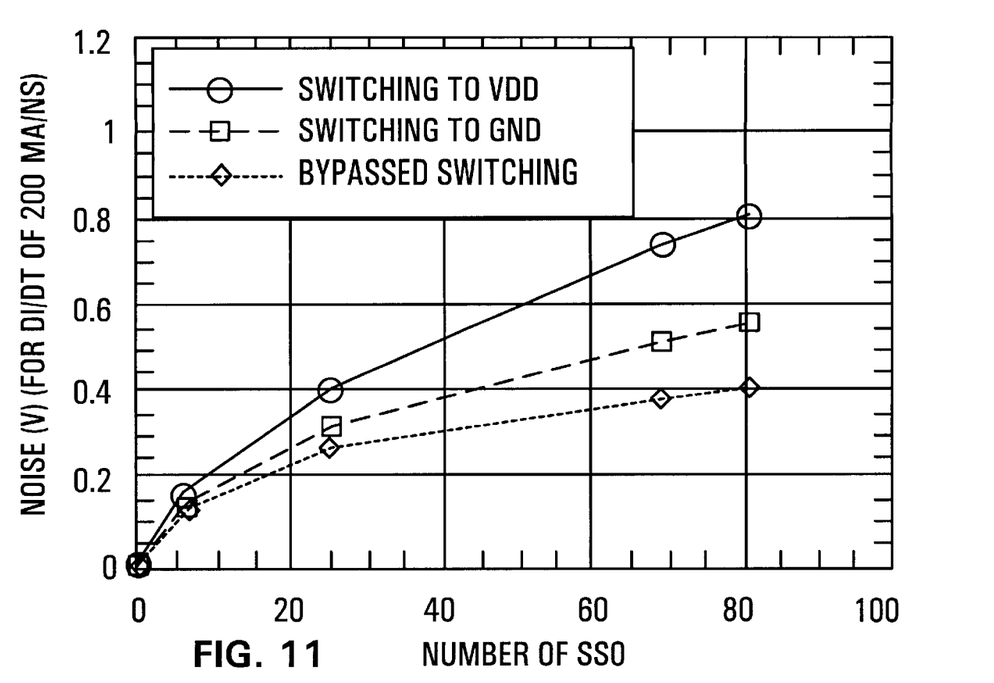
FIG. 11 is a graph of SSO noise for a worst-case signal in the channeled via pattern of FIG. 4.
Figure 12:
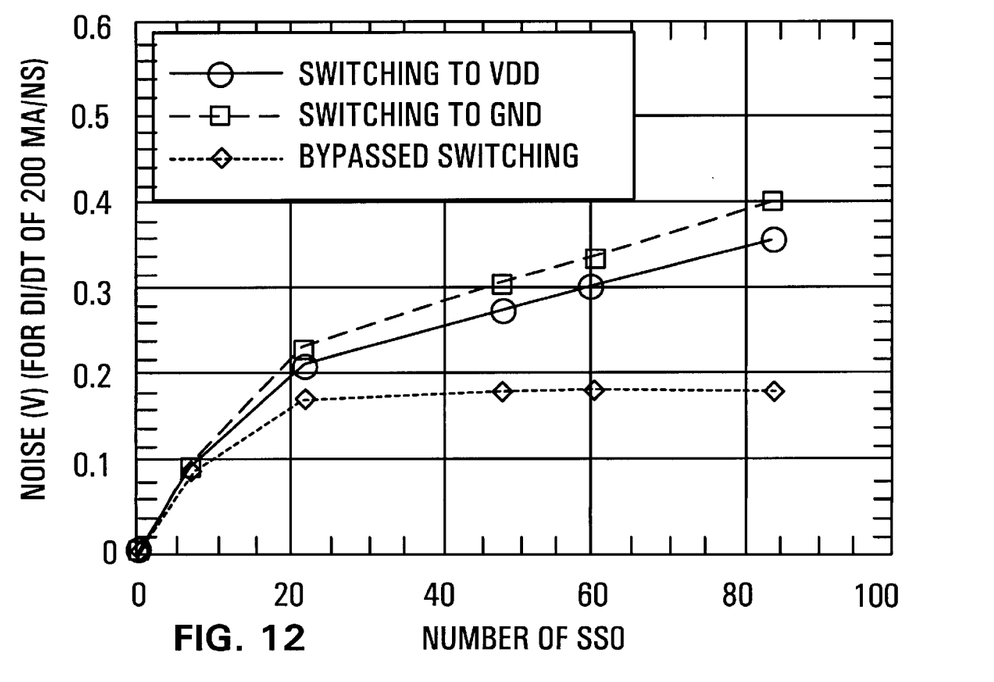
FIG. 12 is a graph of SSO noise for a worst-case signal in the unchanneled via pattern of FIG. 5.
Figure 13:
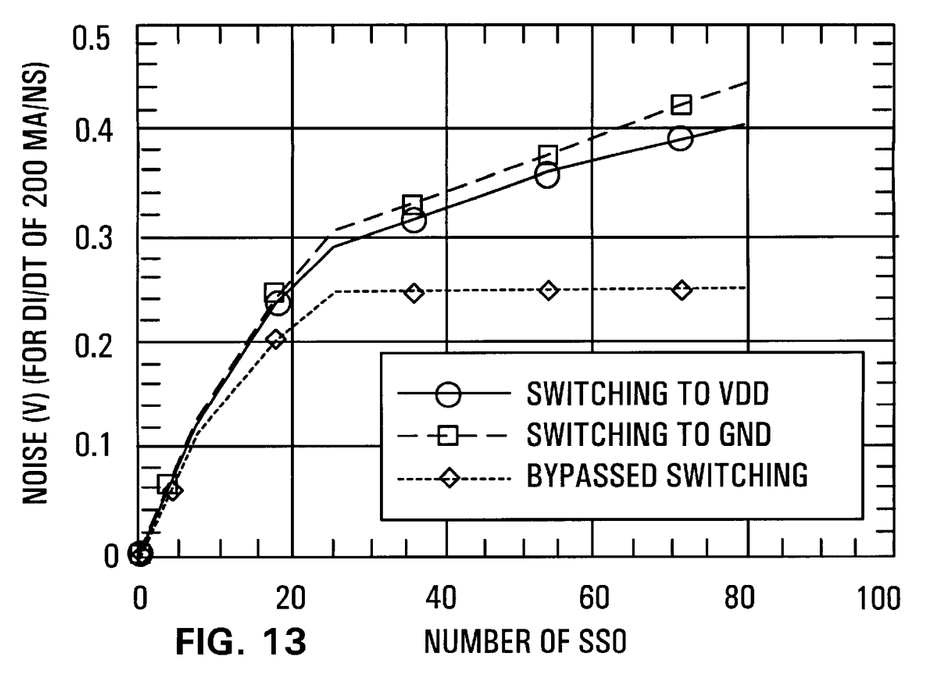
FIG. 13 is a graph of SSO noise for a worst-case signal in the conventional unchanneled via pattern of FIG. 9.
Figure 14:
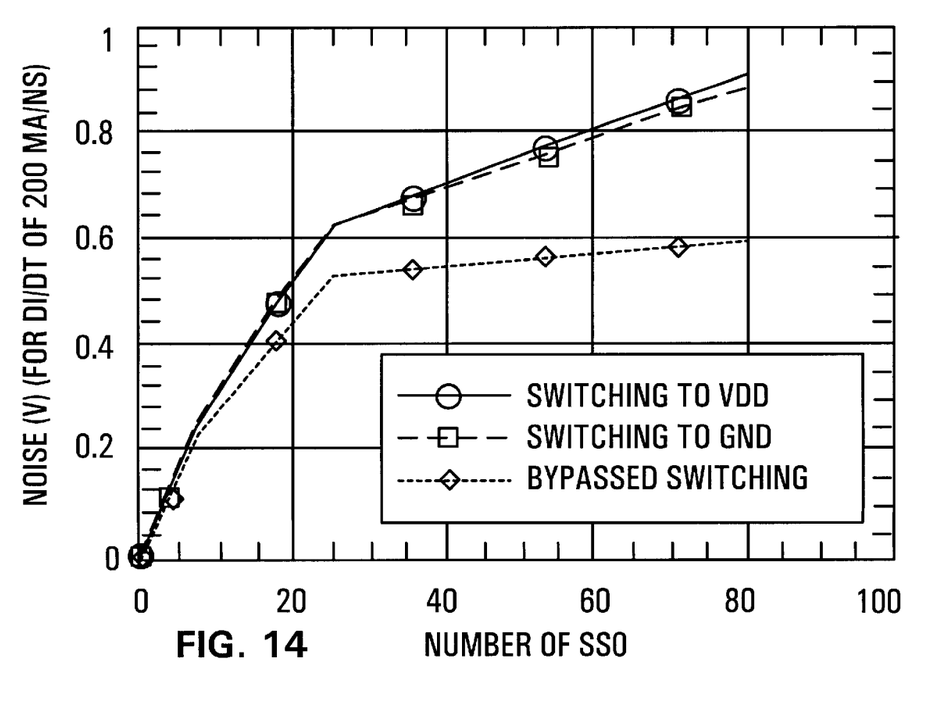
FIG. 14 is a graph of SSO noise for a worst-case signal in the conventional channeled via pattern of FIG. 10.

An alternate pattern used in some BGA layouts is a "channeled" pattern, such as shown by circuit board 20 of FIG. 10, where power and ground interconnection pads 22, 24 are paired next to one another such that multiple power/ground interconnection pads can share the same via 26. Signal interconnection pads 28 are assigned dedicated vias 30, but with power and ground interconnection pads sharing the same vias, channels such as channel 32 are defined between adjacent columns of signal vias 30. Through these channels, multiple signal traces can be routed in a given circuit layer, thereby enabling fewer layers to be used, and decreasing costs. However, while a 3:1:1 signal:power:ground ratio of both interconnection pads and balls is provided, the ratio of vias for the channeled pattern is 6:1:1, which results in decreased SSO performance due to a reduction in the number of power and ground vias, and to their non-optimal placement. As a result, the lower cost provided by the channeled pattern comes with reduced performance.

For many applications, electrical performance may not be as great a concern, and as a result, a channeled pattern may be preferred to lower costs. On the other hand, where electrical performance is a concern, a more costly unchanneled pattern may be used. Particularly for chip manufacturers where a given device may be used in widely different applications, it may be necessary to maintain parallel package families to support both high performance/high cost systems and low performance/low cost systems. Maintaining multiple packages, however, often results in additional non-recurring engineering and support costs, and is thus undesirable.

Therefore, a significant need exists for an improved interconnect pattern that better balances cost and performance, and has a wider variety of uses than traditional interconnect patterns.

SUMMARY OF THE INVENTION

The invention addresses these and other problems associated with the prior art by providing a circuit arrangement incorporating unique interconnect layout patterns that are suitable for use in a wide variety of applications. As a result, often a single layout may be used for a particular chip package to support multiple types of applications, thereby offering a more flexible and cost efficient alternative to conventional layouts that are tailored specifically to single applications, e.g., only high performance applications or low performance applications.

Consistent with one aspect of the invention, a circuit arrangement is provided including a plurality of signal interconnects, a plurality of first fixed potential interconnects, and a plurality of second fixed potential interconnects. Each signal interconnect is configured to transmit a signal, while each first fixed potential interconnect is configured to be electrically connected to a first fixed potential (e.g., power), and each second fixed potential interconnect is configured to be electrically connected to a second fixed potential (e.g., ground). The plurality of signal, first fixed potential and second fixed potential interconnects are arranged into at least first and second adjacent tiles, with each tile defining a plurality of interconnect positions arranged into at least three rows and at least four columns. Further, for each tile, a signal interconnect is disposed at each of the three interconnect positions in each of the first and fourth columns, and one each of a signal interconnect, a first fixed potential interconnect and a second fixed potential interconnect are disposed in each of the second and third columns.

Consistent with another aspect of the invention, a circuit arrangement is provided including a plurality of signal interconnects, a plurality of first fixed potential interconnects, and a plurality of second fixed potential interconnects. The plurality of signal, first fixed potential and second fixed potential interconnects are arranged into an array that defines interior and boundary interconnect positions, with each interconnect disposed at an interior interconnect position bordered on each side by another interconnect in the array, and with each signal interconnect disposed at an interior interconnect position in the array immediately adjacent to at least one first fixed potential interconnect and at least one second fixed potential interconnect in the array.

Circuit arrangements consistent with either aspect of the invention exhibit improved performance compared to circuit arrangements that implement conventional patterns. Moreover, in many embodiments consistent with the invention, the same pattern may be used in both high and low performance applications. Thus, for example, in many instances a chip package constructed consistent with the invention may be utilized with higher performance/higher cost circuit boards, as well as with lower performance/lower cost circuit boards, without modification, thereby decreasing the costs associated with non-recurring engineering and support.

These and other advantages and features, which characterize the invention, are set forth in the claims annexed hereto and forming a further part hereof. However, for a better understanding of the invention, and of the advantages and objectives attained through its use, reference should be made to the Drawings, and to the accompanying descriptive matter, in which there is described exemplary embodiments of the invention.

DETAILED DESCRIPTION

The embodiments of the invention described hereinafter utilize unique interconnect layout patterns that exhibit improved flexibility, performance and cost characteristics than conventional designs. Each interconnect in an interconnect layout pattern is used to electrically (and often mechanically) couple together multiple electronic components, e.g., to couple an integrated circuit device to a substrate such as found on a circuit board, a multichip module, a chip package, or other form of chip carrier, or to couple together multiple substrates such as that in a chip package or multichip module to a circuit board, or to couple multiple circuit boards to one another, etc.

The embodiments hereinafter, for example, focus on the use of a Ball Grid Array (BGA) interconnect structure that electrically and mechanically couples a chip package to a circuit board. In such a structure, matching arrays of conductive balls and ball interconnection pads are respectively disposed on opposing surfaces of a chip package and circuit board, with matching balls and pads bonded to one another through the application of heat and pressure to the assembly. However, it will be appreciated that the invention should not be limited solely to such an application, but may be used in a wide variety of other applications, including those which use alternate interconnect structures such as Pin Grid Arrays (PGA's) and Land Grid Arrays (LGA's), among others. It will also be appreciated that term interconnect may considered to include not only the finished mechanical structures formed between multiple components (e.g., each interconnected ball and ball pad in the aforementioned BGA environment), but also the individual structures defined on each of those components for use in forming the finished mechanical structures (e.g., a ball and/or ball pad on a chip package, or a ball pad on a circuit board), independent the other components used to form the finished structures.

Figure 1:
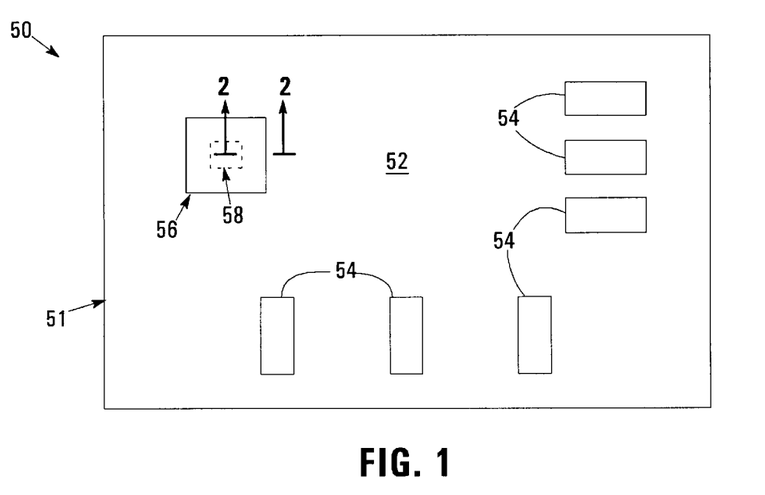
FIG. 1 is a plan view of an electronic device consistent with the invention.

FIG. 1 illustrates an exemplary electronic device 50 consistent with the invention. Electronic device 50 is shown including a circuit board 51 having a first surface 52 upon which is disposed a plurality of integrated circuit devices 54. Also shown on circuit board 51 is a packaged integrated circuit device 56 including a flip chip die 58 housed therein. It should be appreciated that the principles of the invention may apply to practically any type of electronic device within which integrated circuit devices may be utilized. Therefore, the invention should not be limited to the particular implementation disclosed herein.

Figure 2:
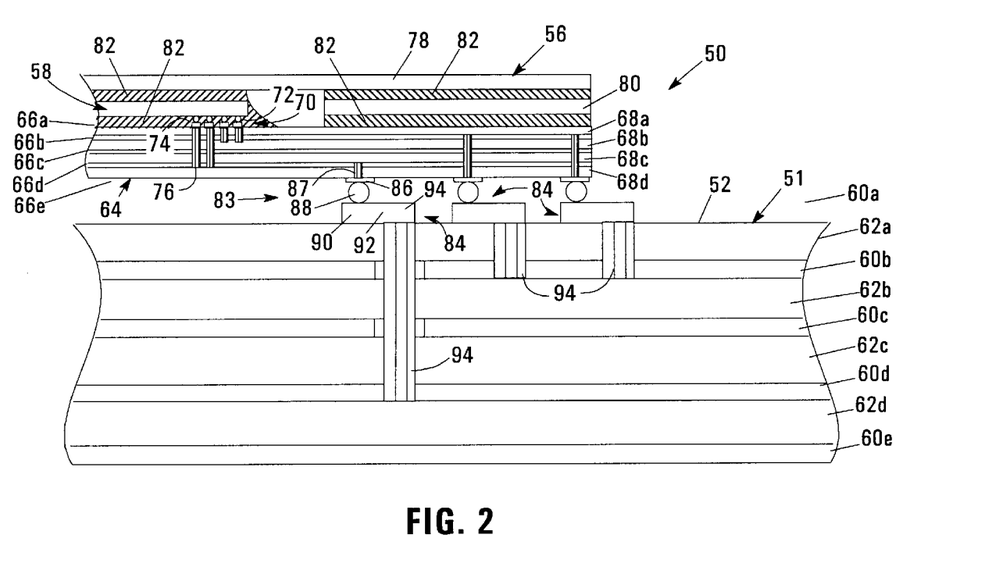
FIG. 2 is a cross-sectional view of a packaged integrated circuit device and circuit board in the electronic device of FIG. 1, taken through lines 2—2.

As shown in FIG. 2, circuit board 51 may be constructed, for example, as a rigid circuit board including a plurality of conductive layers (e.g.,5 conductive layers) 60a, 60b, 60c, 60d and 60e separated by a plurality of rigid insulating substrate layers 62a, 62b, 62c and 62d. Package 56 likewise includes a substrate 64 including a plurality of conductive layers 66a, 66b, 66c, 66d and 66e separated from one another by a plurality of insulating layers 68a, 68b, 68c and 68d. The number of circuit layers in each of circuit board 51 and package 56 will vary for different applications.

Die 58 is implemented as a flip chip which is interfaced with substrate 64 through an interconnection array 70 including a plurality of interconnects, each with a corresponding solder bump 72 disposed on the flip chip die 58, and a bond pad 74 formed within the top circuit layer 66a of the substrate. Substrate 64 is implemented using the innermost circuit layer 66c allocated to ground ($V_{SS}$) and the outermost circuit layers 66a and 66e allocated to interconnection pads and positive voltage ($V_{DD}$). The second and fourth circuit layers 66b and 66d are allocated to signal redistribution, and as such, variable depth vias 76 are utilized to route signals between the interconnection pads in layer 66a and signal traces in circuit layers 66b, 66d.

In the illustrated embodiment, the interconnection array between flip chip die 58 and substrate 64 is implemented with a pitch of about 200 microns and a bump array depth of six bumps in each column, with four bumps devoted to signal distribution and one bump each for power and ground. The I/O pads from the flip chip are connected by means of a redistribution layer, e.g., as disclosed in U.S. patent application Ser. No. 09/157,631 filed on Sep. 21, 1998 by Shenoy et al., which is incorporated by reference herein. Package 56 also includes a heat spreader 78 disposed on the opposing side of the package from circuit board 51, with a stiffener 80 circumscribing the integrated circuit device 58. An encapsulant adhesive 82 is disposed between substrate 64, flip chip 58, stiffener 80 and heat spreader 78 to fully encapsulate the flip chip and provide thermal and environmental protection therefor.

To electrically and mechanically connect package 56 to circuit board 52, an interconnection array 83 is provided, including an ordered array of interconnections 84 disposed at about a 1000 micron (1 mm) pitch. Each interconnection, in a finished product, is considered to include an interconnection pad 86 disposed in layer 66e of substrate 64 and optionally interfaced with other layers in the package substrate by a via 87, and upon which has been deposited a conductive ball 88 in a manner known in the art. Each interconnection 84 also includes a ball interconnection pad 90 formed on circuit layer 60a of circuit board 51. Each ball interconnection pad 90 is coupled via a conductive trace 92 in circuit layer 60a to a via 94 to electrically couple the ball interconnection pad with either a source of ground or power or with a signal trace in another circuit layer of the circuit board.

It will be appreciated that the herein described configurations of package 56 and circuit board 51 are merely exemplary in nature. Moreover, it will be appreciated that any number of known manufacturing processes and techniques may be used to manufacture die 58, package 56 and circuit board 51, as well as to interconnect these components with one another. The invention should therefore not be limited to the particular implementations disclosed herein.

Figure 3:
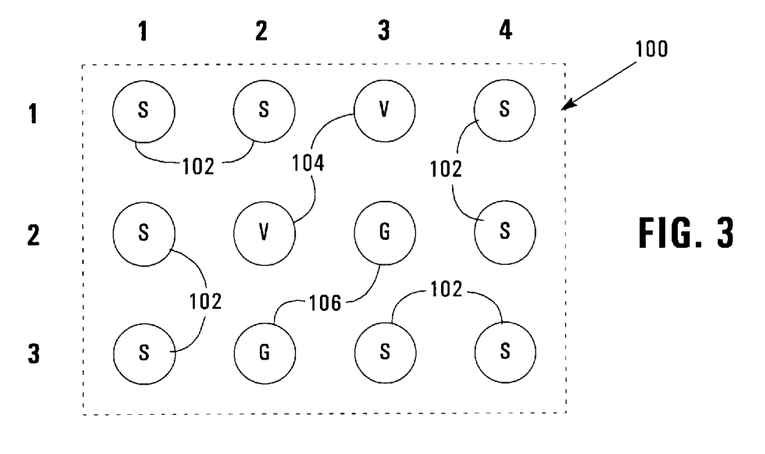
FIG. 3 is a plan view of a tile from the interconnect between the packaged integrated circuit device and circuit board of FIG. 2, illustrating a interconnect layout pattern consistent with the invention.

Consistent with one aspect of the invention, an interconnection array between a circuit board and chip package utilizes a unique arrangement of signal, power and ground interconnects to minimize noise and provide flexible routing of signal traces from the interconnection array to other components on a circuit board. As shown in FIG. 3, one suitable characteristic of an interconnect layout pattern consistent with the invention defines a plurality of tiles, such as tile 100, including at least four columns and three rows. For such an interconnection array, a design rule may be set where, in each of the first and fourth columns of the tile, a signal interconnect 102 (denoted with an "S") is provided in each row position thereof. Then, for the second and third columns, one each of a signal interconnect 102, a power interconnect 104 (denoted with a "V") and a ground interconnect 106 (denoted with a "G") is provided in each such column. In the illustrated embodiment, for example, the second column includes a signal interconnect at the first row position, a power interconnect at the second row position, and a ground interconnect at the third row position. The third column is offset one row position, including a power interconnect 104 at the first row position, a ground interconnect at the second row position 106, and a signal interconnect at the third row position. It should be appreciated, however, that various arrangements of signal, ground and power interconnects may be utilized within each column, yet meet the aforementioned design rule consistent with the invention.

Various modifications may be made to the tile design consistent with the invention. For example, a greater number of columns and/or rows of interconnects may be utilized within each tile. Moreover, the use of a "column" or "row" designation for a tile does not imply that the tile has any particular horizontal or vertical orientation. Also, as used hereinafter, the power and ground interconnects may simply be termed "first fixed potential" and "second fixed potential" interconnects, as each may be used to simply provide two different fixed potential (i.e., non-switching) sources, e.g., positive and negative DC voltage, or other fixed references.

As described above, one benefit of the orientation illustrated in FIG. 3 is that significant flexibility is provided for use of an interconnect array in either high or low performance applications.

Figure 4:
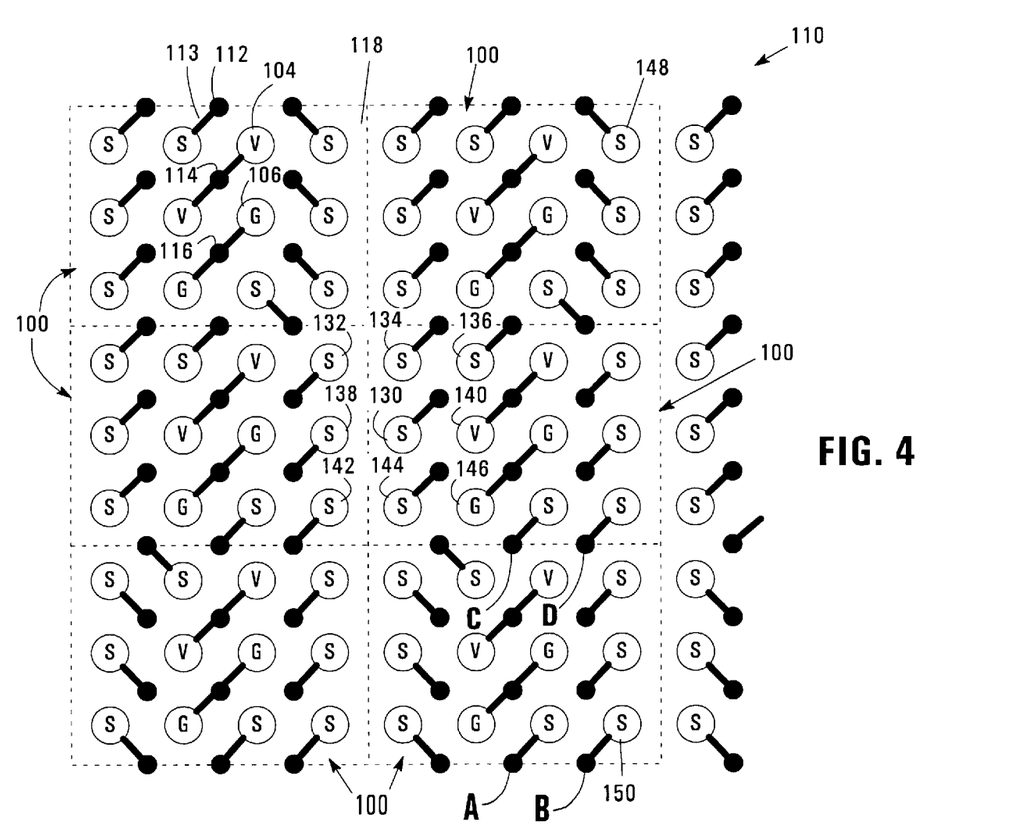
FIG. 4 is a plan view of a circuit board consistent with the invention, illustrating a channeled via pattern interfaced with the interconnect layout pattern of FIG. 3.

FIG. 4, for example, illustrates a circuit board 110 utilizing an arrangement of tiles 100 interconnected via conductive traces 113 to a channeled arrangement of vias 112 to minimize the number of circuit layers required to route signals from the interconnection array to other components on the circuit board. With the disclosed arrangement of signal, power and ground interconnects, the power interconnects 104 are able to share vias 114, while ground interconnects 106 are able to share vias 116, thereby defining channels 118 between the horizontally-adjacent tiles 100. With this configuration, the number of layers required to route signals on the circuit board is minimized, thereby reducing costs. However, the sharing of vias reduces the ratio of signal to power to ground vias to 6:1:1, which somewhat limits performance.

Figure 5:
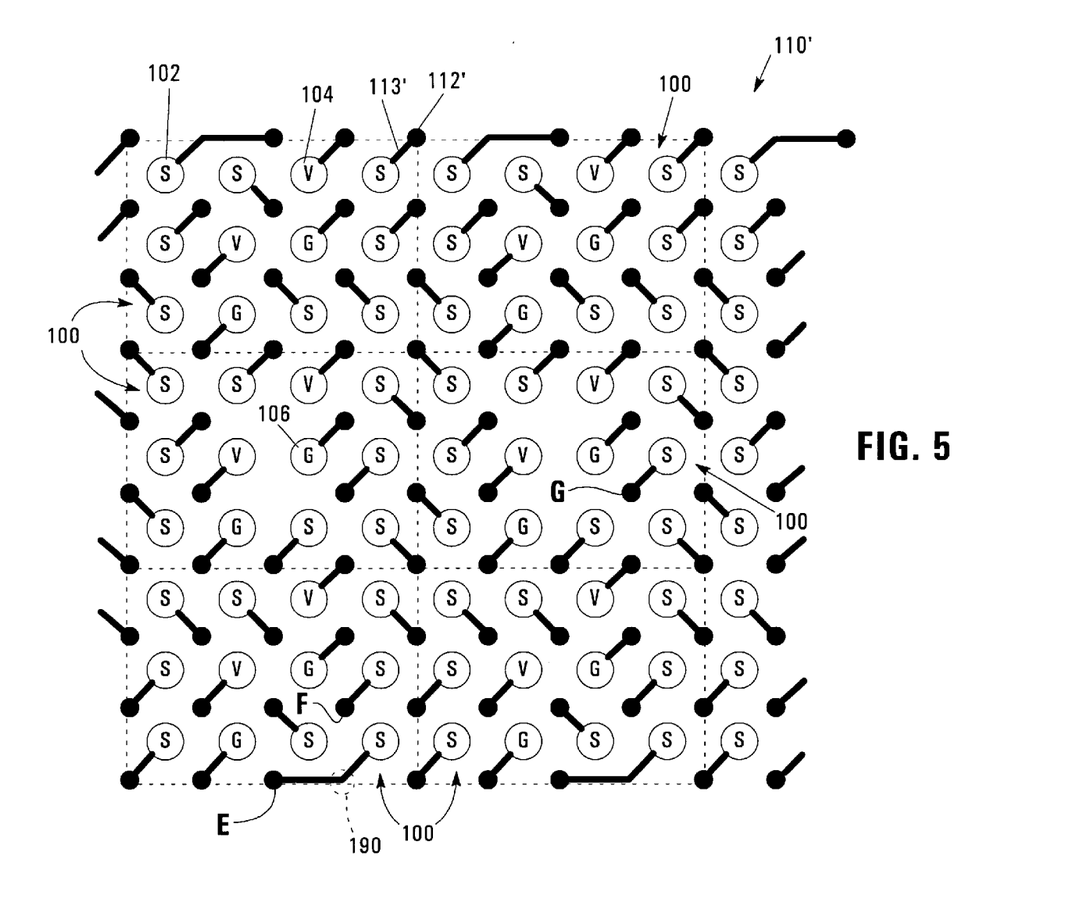
FIG. 5 is a plan view of another circuit board consistent with the invention, illustrating an unchanneled via pattern interfaced with the interconnect layout pattern of FIG. 3.

Next, turning to FIG. 5, an alternate circuit board 110' is shown including the same arrangement of tiles 100, each including the same arrangement of signal, power and ground interconnects 102–106. In FIG. 5, however, an unchanneled arrangement of vias 112' is provided, which couples each interconnect 102–106 to an individual via 112' via a conductive trace 113', such that the ratio of signal to power to ground vias 112' is maintained at the same 4:1:1 ratio as the interconnect array. Consequently, while the number of layers required to route signals is increased due to the lack of channels between vias, performance is improved relative to a channeled via arrangement.

Figure 6:
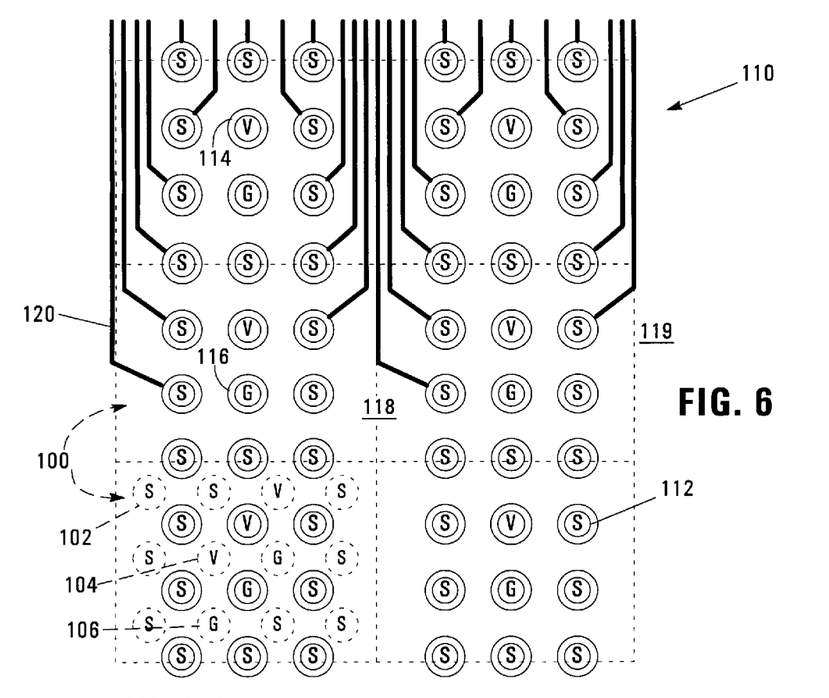
FIG. 6 is a plan view of a first signal routing layer in the circuit board of FIG. 4.
Figure 7:
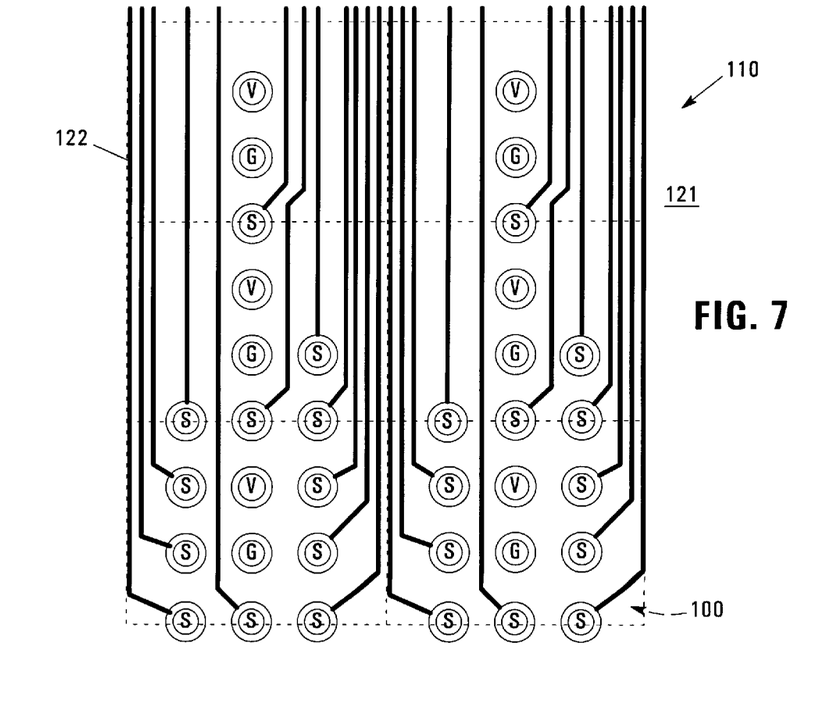
FIG. 7 is a plan view of a second signal routing layer in the circuit board of FIG. 4.

As discussed above, a principal advantage of the channeled pattern described in connection with FIG. 4 is that a reduced number of signal layers is typically required to route signal traces away from the interconnect array. FIGS. 6 and 7, for example, illustrate the routing of signal traces from the interconnection array of FIG. 4 using only two signal layers, with FIG. 6 showing a first signal redistribution layer 119 and FIG. 7 showing a second signal redistribution layer 121. Signal vias 112, power vias 114 and ground vias 116 are represented by double-line circles in FIGS. 6 and 7. Moreover, the arrangement of each tile 100 in the interconnection array is illustrated in phantom in FIG. 6 to provide a frame of reference for vias 112, 114, 116.

For the signal routing example presented herein, it is assumed that a ball array depth of 9 is used, with an interconnect pitch of about 1000 microns (1.0 mm). In addition, it is assumed that the circuit board has about 90 micron minimum line/space dimensions, about 300 micron vias with about 600 micron lands, and about 635 micron interconnection pad diameters. Furthermore, blind and buried vias are supported for distributing signals, with full depth vias, or through holes, used to distribute power and ground. With the aforementioned design rules, only one trace is permitted to be routed between adjacent vias separated by a 1.0 mm pitch, while up to seven traces can be routed in any channels formed between vias (i.e., with a 2.0 mm pitch between vias opposite one another across a channel). Of course, other circuit board and/or package dimensions may be used consistent with the invention, and thus, the invention is not limited to this exemplary implementation.

As shown in FIG. 6, a plurality of conductive traces 120 in circuit layer 119 are used to route signals from signal vias 112, with up to seven such traces routed within the channel region 118 defined between the vias. Moreover, as shown in FIG. 7, the signal vias 112 interconnected by the first signal redistribution layer 119 do not extend to the second distribution layer 121, leaving additional regions suitable for routing of circuit traces 122 in the second signal redistribution layer 121. As a result, design rules may be met in only two signal circuit layers when redistributing signals with a ball array depth of nine. In contrast, using the same design rules, it has been found that the conventional channeled design described above in connection with FIG. 10 requires three signal distribution layers to route the same number of signals away from an interconnection array.

For the unchanneled design shown in FIG. 5, four signal layers are required to route the signals from the interconnection array using the design rules set forth above, and assuming a ball array depth of nine. This requirement is comparable to the layer requirements of the conventional chevron pattern shown in FIG. 9.

Consistent with another aspect of the present invention, a design rule may be specified where each signal interconnect within an interior region of an interconnection array is located immediately adjacent at least one power interconnect and at least one ground interconnect throughout the interior region of the array. As shown in FIG. 4, a signal interconnect within an interior region of the array includes any interconnect that is bounded on all sides by another interconnect. For example, for a regular array, an interior interconnect is bounded by interconnects located at any position that is ±1 row and/or column from that interconnect.

An example of such an interconnect is signal interconnect 130 in FIG. 4, which is bounded in all directions by a plurality of interconnects 132, 134, 136, 138, 140, 142, 144 and 146. Consistent with the design rule described above, at least one power interconnect (here, interconnect 140) and at least one ground interconnect (here, interconnect 146) is immediately adjacent interconnect 130.

While the design rule set forth above does not require the same relationships for boundary interconnect positions (e.g., interconnects 148 and 150), which are not bounded on all sides by other interconnects, it should be appreciated that other designs may be contemplated consistent with the invention that extend this design rule to such boundary interconnects as well.

It is believed that the aforementioned design rules improve electrical performance by improving inductive coupling between all signal interconnections and the interconnections to power and ground, thus ensuring efficient current return paths.

Figure 8:
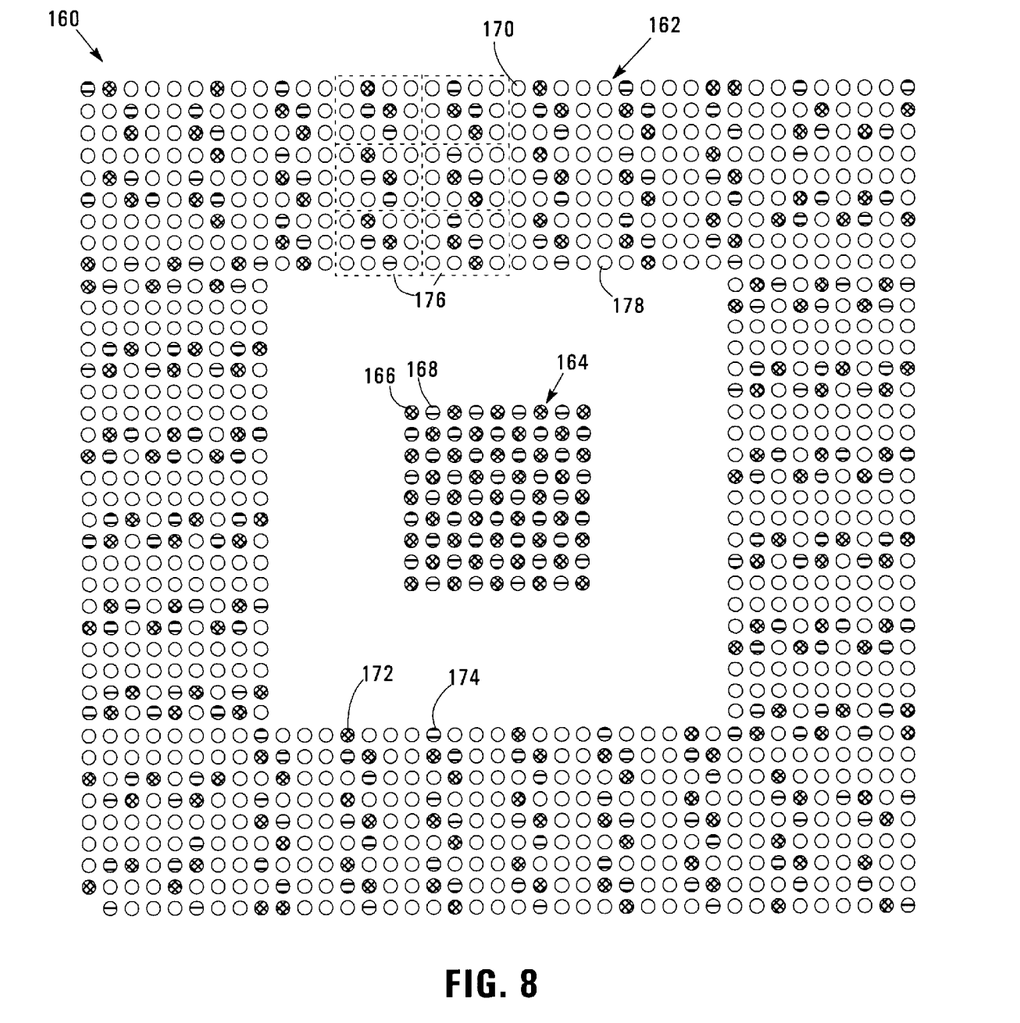
FIG. 8 is a plan view of another interconnect layout pattern consistent with the invention.

A full interconnect layout pattern consistent with the principles of the invention is illustrated at 160 in FIG. 8. The primary interconnect layout is disposed in a picture frame arrangement 162, with a central rectangular array 164 disposed in the center of the layout. Central array 164 includes only power interconnects 166 and ground interconnects 168, and is typically disposed directly underneath the flip chip maintained in the package, for the purpose of supplying power and ground connections to the circuitry in the core of the device with minimum impedance. The primary array 162 includes signal interconnects 170, power interconnects 172 and ground interconnects 174. It is to be noted that, at least with the general exception of some of the interconnects within the corners of the layout, a tiled pattern is used utilizing a plurality of tiles 176 arranged in substantially the same arrangement as tile 100 of FIG. 3, at least to the extent that the second and third columns of each tile include one each of a signal, power and ground interconnect. Moreover, it should be appreciated that, with the exception of the signal interconnects disposed in the boundary interconnect positions of the layout (e.g., signal interconnects 170 and 178, respectively positioned on the outer and inner perimeters of the layout), each signal interconnect is immediately adjacent to at least one each of a ground interconnect and a power interconnect. In other applications, it may be desirable to extend this design rule to either or both of the outer and inner perimeters of the layout.

With this layout, 719 signal interconnects and 180 each of power and ground interconnects are provided in arrangement 162, providing essentially a 4:1:1 signal:power:ground ratio. With the addition of 41 ground and 40 power interconnects in array 164, a total of 1160 interconnects are provided in a 40×40 mm package.

It should be appreciated that a wide variety of alternative patterns may be developed based upon the principles of the invention, and therefore, the implementation illustrated in FIG. 8 should not be used to limit the invention to any particular embodiment.

Working Example

Simulations were performed on the proposed layouts of FIGS. 4 and 5 as compared to the conventional unchanneled and channeled layouts of FIGS. 9 and 10.

The simulations were directed to the via arrays in the circuit board, rather than the interconnect arrays themselves. In conventional routing strategies like the chevron arrangement of FIG. 9, there is a direct translation of the interconnect layout pattern into the via array (except for staggering them since the interconnect pads cannot be located on top of the via pads on a circuit board). An inductance matrix in each case was determined, with an approximation that all of the vias travel through the same vertical distance, i.e., the entire thickness of the circuit board. This has the important advantage of converting the electromagnetic extraction into a 2-dimensional problem, with the additional approximation of neglecting via capacitance. This makes extraction of inductance matrices of 100–125 elements tangible. Also, since the channeled patterns require lesser number of circuit layers as compared to the unchanneled patterns, the shorter via lengths for them were considered.

In each of the four layout patterns, two to four signals were identified as being potential candidates for having the highest SSO noise, and simulations for three possible switching cases were performed for each of those signals. The results are shown below in Table I:

TABLE I

SSO SIMULATORS FOR CRITICAL SIGNALS

| SSO Mode for Array | Switching to $V_{dd}$ (V) | Switching to Ground (V) | Bypassed Switching (V) |
|---|---|---|---|
| FIG. 4 Channeled Pattern (2 signal layers to route) | | | |
| A | 0.79 | 0.49 | 0.36 |
| B | 0.80 | 0.56 | 0.40 |
| C | 0.50 | 0.49 | 0.22 |
| D | 0.58 | 0.56 | 0.29 |
| FIG. 5 Unchanneled Pattern (4 signal layers to route) | | | |
| E | 0.38 | 0.26 | 0.13 |
| F | 0.36 | 0.40 | 0.18 |
| G | 0.32 | 0.38 | 0.16 |
| FIG. 9 Conventional Unchanneled Pattern (4 signal layers to route) | | | |
| H | 0.35 | 0.42 | 0.21 |
| J | 0.41 | 0.44 | 0.25 |
| FIG. 10 Conventional Channeled Pattern (3 signal layers to route) | | | |
| K | 0.83 | 0.81 | 0.52 |
| L | 0.91 | 0.88 | 0.60 |

The maximum SSO noise, corresponding to the case of all but one of the modeled signals switching, was tabulated, and the worst case in each of the 4 patterns was plotted. The results are shown in FIGS. 11–14. As can be seen in these figures, all of the patterns show the typical saturating trend for SSO noise, although some cases show it more distinctly than others.

For the channeled routing case, the channeled pattern of FIG. 4 shows somewhat lower SSO noise than the conventional channeled pattern of FIG. 10, for all the three switching cases, with a fairly significant advantage in the case of switching to ground. The presence of a clearer saturation characteristic in the conventional channeled case likely makes the difference between the two cases somewhat less dramatic than the entries in the table. In this case, the reduction in the number of signal layers in the circuit board is significant and that alone makes the channeled pattern of FIG. 4 the more desirable pattern.

For the unchanneled routing case, either pattern shows a better than 2× reduction in SSO noise, in spite of shorter via lengths for channel routing. This is attributable to the 2× increase in the number of power and ground vias, and also to the placement of these vias. Both the conventional pattern of FIG. 9 and the unchanneled pattern of FIG. 5 require four signal layers to route out and so are comparable in terms of physical design. However, the unchanneled pattern of FIG. 5 has a distinct advantage electrically, since both patterns show fairly distinct saturation characteristics, so a direct comparison from the table may be considered reasonable.

The third, and most important advantage of the herein described interconnect layout pattern is that, as seen above, it leads to very desirable circuit board via patterns in both the channeled and unchanneled routing cases. This is a significant advantage with respect to NRE costs associated with eliminating the need for tooling two families of package designs.

In the simulation performance herein, the unchanneled pattern of FIG. 5 was simulated having two signals (corresponding to signal number "F" in the figure) which are distinctly non-optimal positions, which would have been right in the center of the array. To partially compensate for this, dummy fixed potential vias (e.g., as shown at 190), can be run next to these vias in the circuit board, although the vias will have to traverse one signal layer before the dummy vias are encountered. Two simulations were performed for this case, one with dummy vias, and one without, and the final noise was approximated to have a $\frac{1}{3}$rd contribution from the case without dummy vias, and $\frac{2}{3}$rd contribution from the case with dummy vias. The scaling was conservative, and was incorporated in both the table and in FIG. 12.

It is shown that the behavioral simulation methodology developed and implemented here points out fairly substantial reduction in SSO noise that can be obtained by the aforementioned improvements in package design. Since SSO is the major contributor of noise in high speed electrical packages, these modifications can lead to very significant improvements in electrical performance without adding to package cost.

Various additional modifications may be made consistent with the invention. For example, an interconnect array need not be regular, with interconnects arranged in horizontal and vertical rows and columns. Rather, an array may be offset or staggered in some implementations. Moreover, it should be appreciated that the size and number of interconnects may vary in other implementations. Further, the pitch of each interconnect may vary and may not even be constant throughout an array, and an interconnect array may be used in any of the alternate applications described above. Other modifications will be apparent to one of ordinary skill in the art. Therefore, the invention lies in the claims hereinafter appended.

What is claimed is:

1. A circuit arrangement, comprising:
   (a) a plurality of signal interconnects, each configured to transmit a signal;
   (b) a plurality of first fixed potential interconnects, each configured to be electrically coupled to a first fixed potential; and
   (c) a plurality of second fixed potential interconnects, each configured to be electrically coupled to a second fixed potential;
   wherein the plurality of signal, first fixed potential and second fixed potential interconnects are arranged into at least first and second adjacent tiles, each tile defining a plurality of interconnect positions arranged into at least three rows and at least four columns, and wherein, for each tile, a signal interconnect is disposed at each of the three interconnect positions in each of the first and fourth columns, and one each of a signal interconnect, a first fixed potential interconnect and a second fixed potential interconnect are disposed in each of the second and third columns.

2. The circuit arrangement of claim 1, wherein the pluralities of signal, first fixed potential and second fixed potential interconnects are numbered in a 4:1:1 ratio.

3. The circuit arrangement of claim 1, further comprising a second plurality of signal interconnects, a second plurality of first fixed potential interconnects, and a second plurality of second fixed potential interconnects, wherein the first and second pluralities of signal, first fixed potential and second fixed potential interconnects are arranged into an array, the array defining interior and boundary interconnect positions, wherein each interconnect disposed at an interior interconnect position is bordered on each side by another interconnect in the array, and wherein each signal interconnect disposed at an interior interconnect position in the array is immediately adjacent to at least one first fixed potential interconnect and at least one second potential interconnect in the array.

4. The circuit arrangement of claim 3, wherein at least a portion of the boundary interconnect positions are arranged about an outer perimeter of the array, and wherein each signal interconnect disposed at a boundary interconnect position arranged about the outer perimeter of the array is immediately adjacent to at least one first fixed potential interconnect and at least one second potential interconnect in the array.

5. The circuit arrangement of claim 4, wherein at least a portion of the interconnects in the array are arranged into a picture frame arrangement, wherein at least a portion of the boundary interconnect positions are arranged about an inner perimeter of the picture frame arrangement, and wherein each signal interconnect disposed at a boundary interconnect position arranged about the inner perimeter of the array is immediately adjacent to at least one first fixed potential interconnect and at least one second potential interconnect in the array.

6. The circuit arrangement of claim 5, wherein at least a second portion of interconnects in the array are arranged into a central rectangular array circumscribed by and separated on all sides from the picture frame arrangement, the central rectangular array including only first and second fixed potential interconnects.

7. The circuit arrangement of claim 1, wherein the first fixed potential interconnects are configured to be coupled to a DC power source, and wherein the second fixed potential interconnects are configured to be coupled to ground.

8. The circuit arrangement of claim 1, wherein the interconnects are arranged in a rectangular array having a pitch of about 1.0 mm or less.

9. The circuit arrangement of claim 1, wherein, for each tile, each of the signal, first fixed potential, and second fixed potential interconnects in the second column is disposed in a different row than the respective signal, first fixed potential, and second fixed potential interconnect in the third column.

10. The circuit arrangement of claim 9, wherein, for each tile, the signal interconnect in the second column is disposed in the first row, the signal interconnect in the third column is disposed in the third row, the first fixed potential interconnect in the second column is disposed in the second row, the first fixed potential interconnect in the third column is disposed in the first row, the second fixed potential interconnect in the second column is disposed in the third row, and the second fixed potential interconnect in the third column is disposed in the second row.

11. The circuit arrangement of claim 9, wherein, for each tile, the signal, first fixed potential and second fixed potential interconnects in the second column are each offset one row from the respective signal, first fixed potential and second fixed potential interconnects in the third column.

12. The circuit arrangement of claim 1, further comprising a chip package, wherein each of the signal, first fixed potential and second fixed potential interconnects includes a ball disposed on the chip package.

13. The circuit arrangement of claim 12, further comprising a circuit board electrically and mechanically coupled to the chip package, wherein each of the signal, first fixed potential and second fixed potential interconnects further includes a ball interconnection pad disposed on the circuit board and electrically and mechanically coupled to a corresponding ball on the chip package.

14. The circuit arrangement of claim 1, further comprising a circuit board, wherein each signal, first fixed potential and second fixed potential interconnect includes a ball interconnection pad disposed on the circuit board, and wherein the circuit board includes an array of vias, each extending at least partially through the circuit board and electrically coupled to a ball interconnection pad, and a plurality of signal traces disposed in at least one circuit layer of the circuit board, each electrically coupled to a ball interconnection pad in a signal interconnect through a via.

15. The circuit arrangement of claim 14, wherein the array of vias are arranged in an unchanneled pattern.

16. The circuit arrangement of claim 14, wherein the array of vias are arranged in an channeled pattern.

17. A circuit arrangement, comprising:
   (a) a plurality of signal interconnects, each configured to a transmit a signal;
   (b) a plurality of first fixed potential interconnects, each configured to be electrically coupled to a first fixed potential; and
   (c) a plurality of second fixed potential interconnects, each configured to be electrically coupled to a second fixed potential;

wherein the plurality of signal, first fixed potential and second fixed potential interconnects are arranged into an array, the array defining interior and boundary interconnect positions, wherein each interconnect disposed at an interior interconnect position is bordered on each side by another interconnect in the array, and wherein each signal interconnect disposed at an interior interconnect position in the array is immediately adjacent to at least one first fixed potential interconnect and at least one second fixed potential interconnect in the array.

18. The circuit arrangement of claim 17, wherein at least a portion of the boundary interconnect positions are arranged about an outer perimeter of the array, and wherein each signal interconnect disposed at a boundary interconnect position arranged about the outer perimeter of the array is immediately adjacent to at least one first fixed potential interconnect and at least one second potential interconnect in the array.

19. The circuit arrangement of claim 18, wherein at least a portion of the interconnects in the array are arranged into a picture frame arrangement, wherein at least a portion of the boundary interconnect positions are arranged about an inner perimeter of the picture frame arrangement, and wherein each signal interconnect disposed at a boundary interconnect position arranged about the inner perimeter of the array is immediately adjacent to at least one first fixed potential interconnect and at least one second potential interconnect in the array.

20. The circuit arrangement of claim 19, wherein at least a second portion of interconnects in the array are arranged into a central rectangular array circumscribed by and separated on all sides from the picture frame arrangement, the central rectangular array including only first and second fixed potential interconnects.

21. The circuit arrangement of claim 17, wherein at least a portion of the plurality of signal, first fixed potential and second fixed potential interconnects are arranged into at least first and second adjacent tiles, each tile defining a plurality of interconnect positions arranged into at least three rows and at least four columns, and wherein, for each tile, a signal interconnect is disposed at each of the three interconnect positions in each of the first and fourth columns, and one each of a signal interconnect, a first fixed potential interconnect and a second fixed potential interconnect are disposed in each of the second and third columns.

22. The circuit arrangement of claim 17, wherein the pluralities of signal, first fixed potential and second fixed potential interconnects are numbered in a 4:1:1 ratio.

23. The circuit arrangement of claim 17, wherein the first fixed potential interconnects are configured to be coupled to a DC power source, and wherein the second fixed potential interconnects are configured to be coupled to ground.

24. The circuit arrangement of claim 17, wherein the interconnects are arranged in a rectangular array having a pitch of about 1.0 mm or less.

25. The circuit arrangement of claim 17, further comprising a chip package, wherein each of the signal, first fixed potential and second fixed potential interconnects includes a ball disposed on the chip package.

26. The circuit arrangement of claim 25, further comprising a circuit board electrically and mechanically coupled to the chip package, wherein each of the signal, first fixed potential and second fixed potential interconnects further includes a ball interconnection pad disposed on the circuit board and electrically and mechanically coupled to a corresponding ball on the chip package.

27. The circuit arrangement of claim 17, further comprising a circuit board, wherein each signal, first fixed potential and second fixed potential interconnect includes a ball interconnection pad disposed on the circuit board, and wherein the circuit board includes an array of vias, each extending at least partially through the circuit board and electrically coupled to a ball interconnection pad, and a plurality of signal traces disposed in at least one circuit layer of the circuit board, each electrically coupled to a ball interconnection pad in a signal interconnect through a via.

28. The circuit arrangement of claim 27, wherein the array of vias are arranged in an unchanneled pattern.

29. The circuit arrangement of claim 27, wherein the array of vias are arranged in an channeled pattern.

30. A circuit arrangement, comprising:
(a) a packaged integrated circuit device, the packaged integrated circuit device including a flip chip bonded to a first side of a package substrate, the package substrate including a second side;
(b) a circuit board having a first side; and
(c) an interconnect array including a plurality of interconnects electrically and mechanically coupling the packaged integrated circuit device to the circuit board, each interconnect including a ball coupled to the second side of the package substrate and a ball interconnection pad disposed on the first side of the circuit board, the plurality of interconnects including signal interconnects configured to transmit signals, first fixed potential interconnects configured to be electrically coupled to a first fixed potential, and second fixed potential interconnects configured to be electrically coupled to a second fixed potential;

wherein the signal, first fixed potential and second fixed potential interconnects are arranged into at least first and second adjacent tiles, each tile defining a plurality of interconnect positions arranged into at least three rows and at least four columns, and wherein, for each tile, a signal interconnect is disposed at each of the three interconnect positions in each of the first and fourth columns, and one each of a signal interconnect, a first fixed potential interconnect and a second fixed potential interconnect are disposed in each of the second and third columns.

31. A circuit arrangement, comprising:
(a) a packaged integrated circuit device, the packaged integrated circuit device including a flip chip bonded to a first side of a package substrate, the package substrate including a second side;
(b) a circuit board having a first side; and
(c) an interconnect array including a plurality of interconnects electrically and mechanically coupling the packaged integrated circuit device to the circuit board, each interconnect including a ball coupled to the second side of the package substrate and a ball interconnection pad disposed on the first side of the circuit board, the plurality of interconnects including signal interconnects configured to transmit signals, first fixed potential interconnects configured to be electrically coupled to a first fixed potential, and second fixed potential interconnects configured to be electrically coupled to a second fixed potential;

wherein the signal, first fixed potential and second fixed potential interconnects are arranged into an array defining interior and boundary interconnect positions, wherein each interconnect disposed at an interior interconnect position is bordered on each side by another interconnect in the array, and wherein each signal interconnect disposed at an interior interconnect position in the array is immediately adjacent to at least one first fixed potential interconnect and at least one second fixed potential interconnect in the array.

* * * * *